(12) United States Patent
Deboer et al.

(10) Patent No.: US 7,268,072 B2
(45) Date of Patent: Sep. 11, 2007

(54) METHOD AND STRUCTURE FOR REDUCING CONTACT ASPECT RATIOS

(75) Inventors: Scott J. Deboer, Boise, ID (US); Vishnu K. Agarwal, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 205 days.

(21) Appl. No.: 11/088,311

(22) Filed: Mar. 23, 2005

(65) Prior Publication Data

US 2005/0164481 A1 Jul. 28, 2005

Related U.S. Application Data

(60) Division of application No. 10/714,688, filed on Nov. 17, 2003, now Pat. No. 6,878,587, which is a continuation of application No. 09/997,660, filed on Nov. 28, 2001, now Pat. No. 6,670,238, which is a continuation of application No. 09/334,842, filed on Jun. 16, 1999, now Pat. No. 6,365,453.

(51) Int. Cl.
*H01L 21/4763* (2006.01)

(52) U.S. Cl. ............................... 438/637; 257/E21.585

(58) Field of Classification Search ................ 438/637; 257/E21.658, E21.557, E21.585
See application file for complete search history.

(56) References Cited

U.S. PATENT DOCUMENTS 5,057,888 A   10/1991   Fazan et al.
5,250,457 A   10/1993   Dennison
5,292,677 A   3/1994    Dennison
5,338,700 A   8/1994    Dennison et al.
5,401,681 A   3/1995    Dennison
5,488,011 A   1/1996    Figura et al.
5,554,557 A   9/1996    Koh
5,714,778 A * 2/1998    Yamazaki ................... 257/298
5,940,714 A   8/1999    Lee et al.
5,998,257 A   12/1999   Lane et al.
6,046,093 A   4/2000    DeBoer et al.
6,083,803 A   7/2000    Fischer et al.
6,083,831 A   7/2000    Dennison
6,174,767 B1  1/2001    Chi
6,184,079 B1  2/2001    Lee (Continued)

OTHER PUBLICATIONS

Sakao et al., "A Capacitor-Over-Bit-Line (COB) Cell With a Hemi-spherical-Grain Storage Node For 64 Mb DRAMs," IEDM, vol. 90, San Francisco, Dec. 9-12, 1990, pp. 27.3.1-27.3.4.

*Primary Examiner*—Bradley K. Smith
(74) *Attorney, Agent, or Firm*—Knobbe, Martens Olson & Bear LLP

(57) ABSTRACT

An intermediate metal plug is used to raise the platform to which contact is to be made. In the illustrated process, a partial bit line plug is formed adjacent a stacked capacitor, and an interlevel dielectric formed over the capacitor. The bit line contact is completed by extending a via from the bit line, formed above the interlevel dielectric, down to the level of the intermediate plug, and the via is filled with metal. The height of the via to be filled is thus reduced by the height of the intermediate plug. In one embodiment, the intermediate plug is slightly shorter than an adjacent container-shaped capacitor. In another embodiment, the intermediate plug is about as high as an adjacent stud capacitor.

19 Claims, 9 Drawing Sheets

U.S. PATENT DOCUMENTS

| | | |
|---|---|---|
| 6,204,143 B1 | 3/2001 | Roberts et al. |
| 6,221,711 B1 | 4/2001 | Roberts et al. |
| 6,222,222 B1 | 4/2001 | DeBoer et al. |
| 6,365,453 B1 | 4/2002 | Deboer et al. |
| 6,417,065 B1 | 7/2002 | Wu et al. |
| 6,469,336 B2 | 10/2002 | Deboer et al. |
| 6,670,238 B2 | 12/2003 | Deboer et al. |
| 6,677,636 B2 | 1/2004 | Deboer et al. |
| 6,720,609 B2 | 4/2004 | Deboer et al. |
| 6,852,579 B2 * | 2/2005 | Kumauchi et al. .......... 438/167 |
| 6,878,587 B2 | 4/2005 | Deboer et al. |
| 2003/0148603 A1 * | 8/2003 | Gardner ...................... 438/637 |

* cited by examiner

METHOD AND STRUCTURE FOR REDUCING CONTACT ASPECT RATIOS

REFERENCE TO RELATED APPLICATION

This application is a divisional of application Ser. No. 10/714,688, filed Nov. 17, 2003 now U.S. Pat. No. 6,878,587, which is a continuation of application Ser. No. 09/997,660, filed Nov. 28, 2001 (now U.S. Pat. No. 6,670,238, issued Dec. 30, 2003), which is a continuation of application Ser. No. 09/334,842, filed Jun. 16, 1999 (now U.S. Pat. No. 6,365,453, issued Apr. 2, 2002).

BACKGROUND OF THE INVENTION

1. Field of the Invention

The present invention relates generally to the formation of contacts in integrated circuits, and more particularly to a method of forming bit line contacts in dynamic random access memory chips.

2. Description of the Related Art

Integrated circuits, also commonly referred to as semiconductor devices, are formed of various electrically conducting, semiconducting and insulating materials. Silicon, in single crystal, amorphous or polycrystalline form, is the most commonly used semiconductor material. Silicon can be made electrically conductive by adding impurities, commonly referred to as doping. Through a series of doping, deposition and etch steps, electrical devices are formed and interconnected to produce the integrated circuits.

Dynamic random access memory (DRAM) circuits include arrays of memory cells, each of which includes two basic components: a field effect transistor (FET) and a storage capacitor. Typically, a semiconducting substrate is doped to produce active areas of an access transistor, one of which is connected to the lower or storage electrode of the capacitor. The other active area and the transistor gate electrode are connected to external connection lines, namely digit or bit lines and word lines or rows. The top or reference electrode of the capacitor is connected to a reference voltage. DRAM arrays thus include a transistors, capacitors and contacts to interconnecting lines.

It is advantageous to form integrated circuits with smaller individual elements so that as many elements as possible may be formed in a single chip. In this way, electronic equipment becomes smaller and more reliable, assembly and packaging costs are minimized and circuit performance is improved. In particular, denser device packing leads to faster and more efficient circuit operation. Despite the focus on continued miniaturization, the storage capacity of the cell capacitor must generally remain above a minimum level to ensure reliable operation (low error rates). Consequently, the development of faster and more powerful DRAM chips focuses in large part on maintaining capacitance despite shrinking available chip area for each memory cell.

One way in which capacitance has been increased has been to increase the surface area of the capacitor electrodes by creating three-dimensional folding structures to which the electrodes conform. When the capacitor is formed above the transistors, they are known in the industry as "stacked" capacitors. Stacked capacitors advantageously demonstrate high capacitance per unit of occupied chip area ("footprint"), high reliability and simple process integration relative to other capacitor designs.

As noted, in the process of fabricating a DRAM chip, electrical connections must be made to the transistor active areas. The active areas, which are also known as source and drain regions, are discrete doped regions in the surface of the semiconductor substrate. As the size of the DRAM is reduced, the size of the active areas and the corridors available for contacts to reach the active areas are also reduced. At the same time, insulating materials must be maintained to effectively isolate the contacts from the transistor and capacitor components. Accordingly, the width of bit line contacts, and other integrated contacts generally, must shrink as device packing density increases.

Unfortunately, while contact width continually decreases, contact height cannot decrease proportionately. Rather, the contact height is defined by the thickness of the interlevel dielectric (ILD) which separates the two levels in the circuit, such as the substrate and higher wiring levels. The ILD thickness, in turn, must be maintained to minimize the risk of short circuits, as well as to prevent interlevel capacitance, which can tie up electrical carriers and slow signal propagation.

Relative increases in contact height is particularly acute in DRAM circuit designs which incorporate stacked capacitors. As noted, capacitance is proportional to the surface area, which depends on both height and width. In order to maintain the same or higher level of capacitance from generation to generation, the capacitor height must remain the same or even increase as device spacing decreases. In bit-over-capacitor (BOC) designs, the bit line contact increases in height along with the capacitor.

While contact width decreases and contact height is essentially maintained, the aspect ratio (defined as the ratio of height to width of a contact) of contacts continues to increase. In general, therefore, each successive generation of integrated circuits incorporates contacts of higher aspect ratios, and this is particularly true for certain DRAM circuit designs. As is well known in the art of integrated circuit fabrication, high aspect ratio contact vias are very difficult to fill without forming keyholes.

One partial solution to this problem is to reduce the dielectric constant of the ILD. A lowered dielectric constant enables thinning ILDs for a given tolerable parasitic capacitance, and consequently lowers the aspect ratio. This solution, however, can only be carried so far before the dielectric loses its insulating qualities, or the risk of short circuits through the thinned ILD becomes too high. Moreover, this solution does not address the high aspect ratios of bit line contacts necessitated by high stacked capacitors in bit-over-capacitor DRAM circuit designs.

Accordingly, a need exists for more effective methods of forming contacts between levels in integrated circuits.

SUMMARY OF THE INVENTION

In accordance with a disclosed embodiment, intermediate conductive plugs raise the platform from which a contact extends. In DRAM fabrication, for example, a partial bit line plug is formed adjacent a stacked capacitor, and an interlevel dielectric formed over the capacitor. The bit line contact is completed by extending a via from the bit line, formed above the interlevel dielectric, down to the level of the intermediate plug, and the via is filled with metal. The height of the via to be filled is thus reduced by the height of the intermediate plug.

In one embodiment, sacrificial plugs are simultaneously formed adjacent the intermediate metal plugs. The sacrificial plugs can be selectively removed, while the intermediate plugs are shielded from etch, and the capacitors formed in the resulting container. In another embodiment, the bottom electrodes for stud capacitors are simultaneously formed adjacent the intermediate metal plugs.

In accordance with one aspect of the invention, therefore, an integrated circuit contact is provided. The integrated circuit includes an electronic device formed above a semiconductor substrate, extending from a first level to a second level. A conducting line overlies the electronic device, electrically insulated by an interlevel dielectric. A contact plug extends downwardly through the interlevel dielectric to an intermediate level above the first level, while remaining electrically insulated from the direct contact with the electronic device.

In accordance with another aspect of the invention, a method is provided for forming electrical contact between levels in an integrated circuit. A conductive plug is formed and covered with a shield. While the plug remains covered, an electrical device is at least partially formed adjacent the conductive plug. After the shield is opened, a contact is then extended to directly contact the conductive plug.

BRIEF DESCRIPTION OF THE DRAWINGS

These and other aspects of the invention will be readily apparent from the attached detailed description, claims and drawings, wherein like numerals will be used to refer to like parts, and in which:

DETAILED DESCRIPTION OF THE PREFERRED EMBODIMENT

While the preferred embodiment is described in the context of a bit line contact in a dynamic random access memory array, the skilled artisan will find application for the described invention in a variety of other contexts. The process and structures described herein have particular utility for forming electrical contacts through intermediate levels in integrated circuits.

Figure 1:
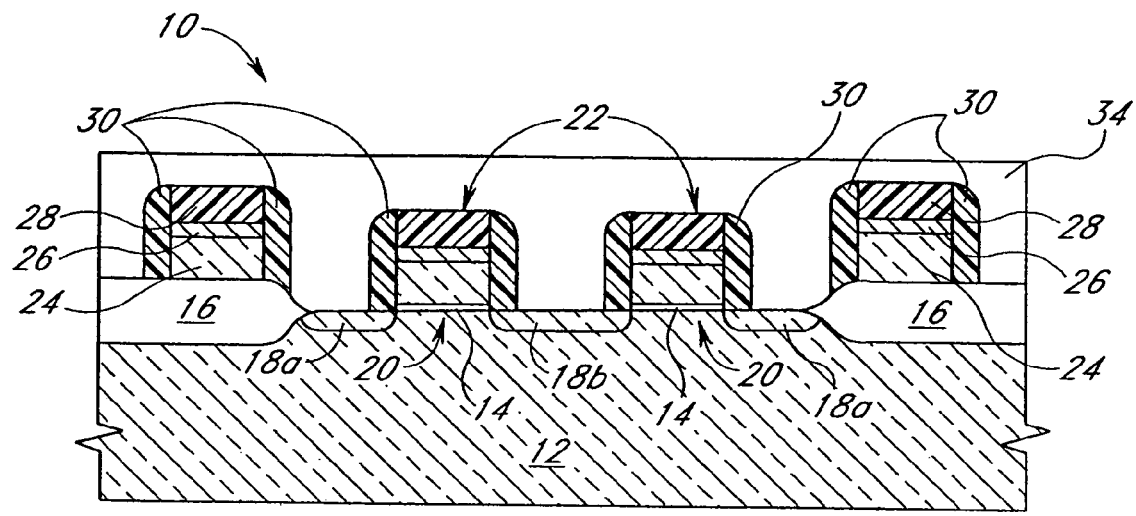
FIG. 1 is a partial, schematic, sectional view of a partially fabricated integrated circuit, constructed in accordance with a preferred embodiment of the present invention, having a plurality of transistors formed therein and a first interlevel dielectric covering the transistors.

Referring to FIG. 1, a partially fabricated integrated circuit will be referred to as a wafer 10 for convenience. The wafer 10 includes a semiconductor substrate 12, gate insulating layers 14 and field isolation regions 16, as will be understood by the skilled artisan. The illustrated isolation regions 16 comprise field oxide grown by local oxidation of silicon, or LOCOS, though other isolation techniques are also contemplated (e.g., shallow trench isolation, or STI). While the illustrated substrate 12 comprises the upper portions of a single-crystal silicon wafer, the skilled artisan will appreciate that the substrate will generally comprise a semiconductor layer or structure in which active or operable portions of electronic devices are formed.

Impurities are diffused or implanted in the surface of substrate 12 to form source/drain regions 18a and 18b for access transistors 20. Transistor gate electrodes 22 of the illustrated embodiment include a polysilicon layer 24, a tungsten silicide layer 26 and a protective cap layer 28. Insulating spacers 30 are formed on either side of the transistor gate electrodes 22. The cap layer 28 and insulating spacers 30 are preferably made of silicon nitride. The skilled artisan will understand, however, that the compositions of the gate stacks and other lower device elements are not central to the invention and can take a variety of forms. Further details are omitted for simplicity.

A first interlevel dielectric (ILD) layer 34 is then deposited over the transistors 20 and is preferably planarized. The illustrated first ILD 34 comprises borophosphosilicate glass (BPSG), although the skilled artisan will readily appreciate that many other materials are suitable for use as an ILD, such as TEOS, spin-on glass (SOG), and polyamide. The first ILD 34 is deposited to a thickness adequate to electrically isolate the underlying transistors 20, preferably between about 0.2 µm and 0.8 µm.

Figure 2:
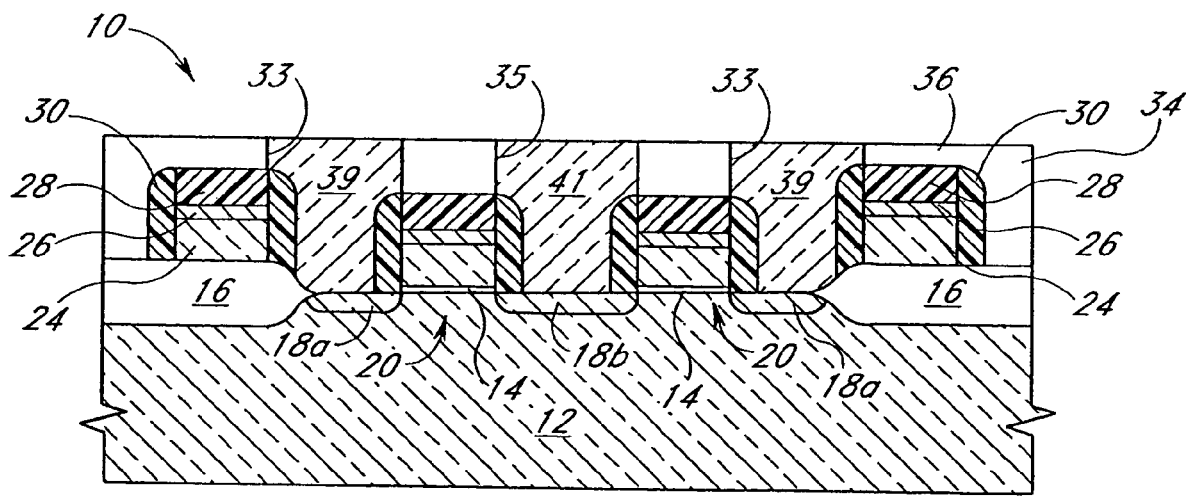
FIG. 2 shows the integrated circuit of FIG. 1 after a plurality of conductive plugs are formed through the first interlevel dielectric to contact the transistor active areas.

Referring to FIG. 2, the lower insulating layer 34 is patterned and etched to define contact vias 33 and 35, exposing the substrate 12 at the active areas 18a and 18b, respectively. This etch is preferably an anisotropic reactive ion etch (RIE), which advantageously produces vertical sidewalls, allowing for tighter packing densities. The contact vias 33, 35 are filled with conductive material and recessed or planarized to form capacitor contact plugs 39 (over which cell capacitors are to be formed) and first bit line contact plugs 41 (over which the bit line contacts are to be formed). Typically, such plugs are formed by chemical vapor deposition (CVD) of conductive materials such as tungsten or polysilicon into the vias 33, 35, for good step coverage into the tight confines between the gate electrodes 22. In the illustrated embodiment, the plugs 39, 41 are formed of polysilicon, which advantageously integrates well with the active areas 18 of the substrate 12.

Figure 3A:
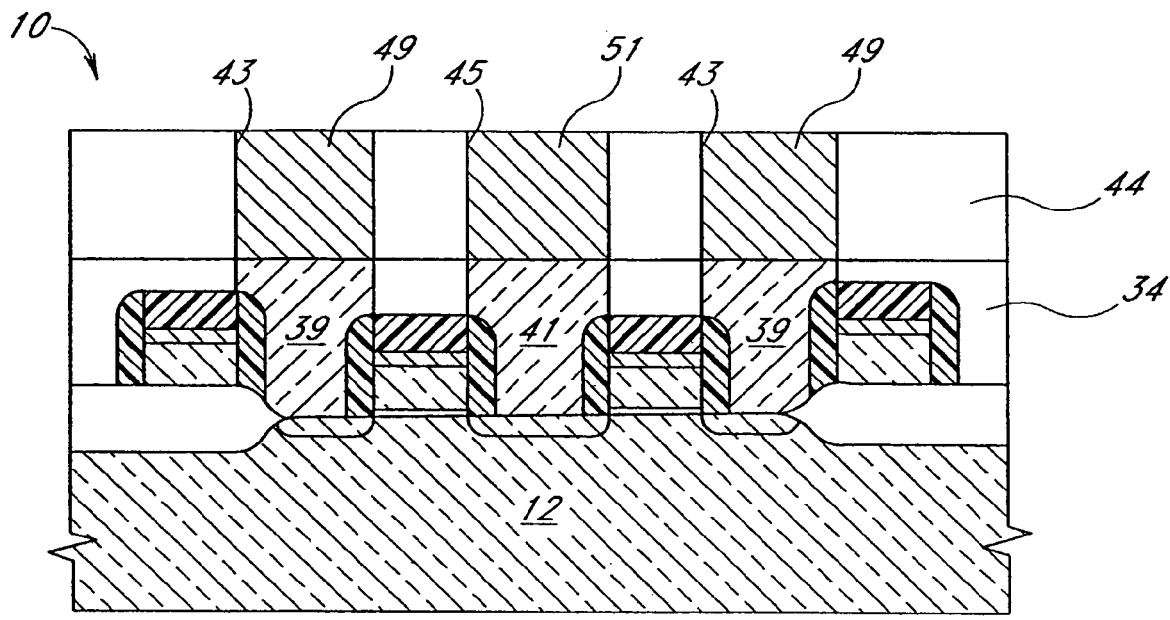
FIG. 3A shows the integrated circuit of FIG. 2 after a second interlevel dielectric layer is formed and conductive plugs formed therethrough to electrically contact the underlying plugs.

Referring to FIG. 3A, a second ILD 44, also preferably comprising BPSG, is deposited over the first ILD 34 and plugs 39, 41. The thickness of the second ILD 44 is determined by design and operational considerations, such as the desired overall height of the cell capacitors. As will be understood in view of the entirety of the disclosed process, the second ILD 44 defines the amount by which the contact height is reduced. Preferably, the second ILD 44 is greater than about 20% of the overall desired height of the adjacent electrical devices (cell capacitors), and more preferably greater than about 50% of the overall desired height. In the illustrated embodiment, the second ILD 44 has a preferred thickness between about 0.8 μm and 2.0 μm, and more preferably between about 1.0 μm and 1.5 μm.

The second ILD 44 is patterned and etched to define vias 43, 45 over the plugs 39, 41, which vias are then filled and recessed or planarized to form sacrificial capacitor plugs 49 and second bit line plugs 51 (one shown). The same mask may be employed as was used for the first vias 33, 35, as illustrated, thereby aligning the plugs 49 with the underlying capacitor contact plugs 39, and saving the costs of an additional mask design. Preferably, however, the sacrificial capacitor plugs 49 are made wider than the underlying contact plugs 49, since more space exists above the tightly packed gate electrodes. A greater width for these plugs will allow for greater capacitance, as will be understood in light of the disclosure hereinbelow. The sacrificial plugs 49 are preferably elliptical, where one dimension is between about 0.25 μm and 0.60 μm and a second dimension is between about 0.10 μm and 0.40 μm. The elliptical configuration advantageously maximizes use of available space for the cell capacitor.

It will also be understood that the second bit line contact plug 51 need not have the same width as the sacrificial capacitor plugs 49, and similarly for the underlying plugs 39, 41. The width of the second bit line plug 51 is preferably between about 0.10 μm and 0.30 μm, and more preferably between about 0.15 μm and 0.25 μm.

While not individually illustrated, the plugs 49, 51 formed in the second ILD 44 preferably include a plurality of layers. For example, a first lining layer of refractive metal (e.g., titanium, tanatalum, cobalt, nickel) is preferably first deposited into the vias, to form a silicide with the polysilicon of the underlying plugs 39, 41 and to assist adhesion to the BPSG sidewalls of the vias. A layer of metal nitride (e.g., TiN) preferably follows, to form a diffusion barrier. Such liners for metal plugs are well known and need not be detailed here. Furthermore, additional features, such as etch stop layers, may be incorporated into the process flow to facilitate alignment of the plugs, as will be appreciated by the skilled artisan.

A conductive filler material is then deposited into the lined vias and recessed or planarized to complete the plugs 49, 51. The filler preferably comprises CVD tungsten, but may also comprise other materials such as force-fill aluminum, hot aluminum, or any other suitable conductive material. In other arrangements, particularly where high dielectric constant materials are employed, non-oxidizing conductors such as Ru, $RuO_x$, Pt, Ir, $IrO_x$, etc. are preferred.

Figure 3B:
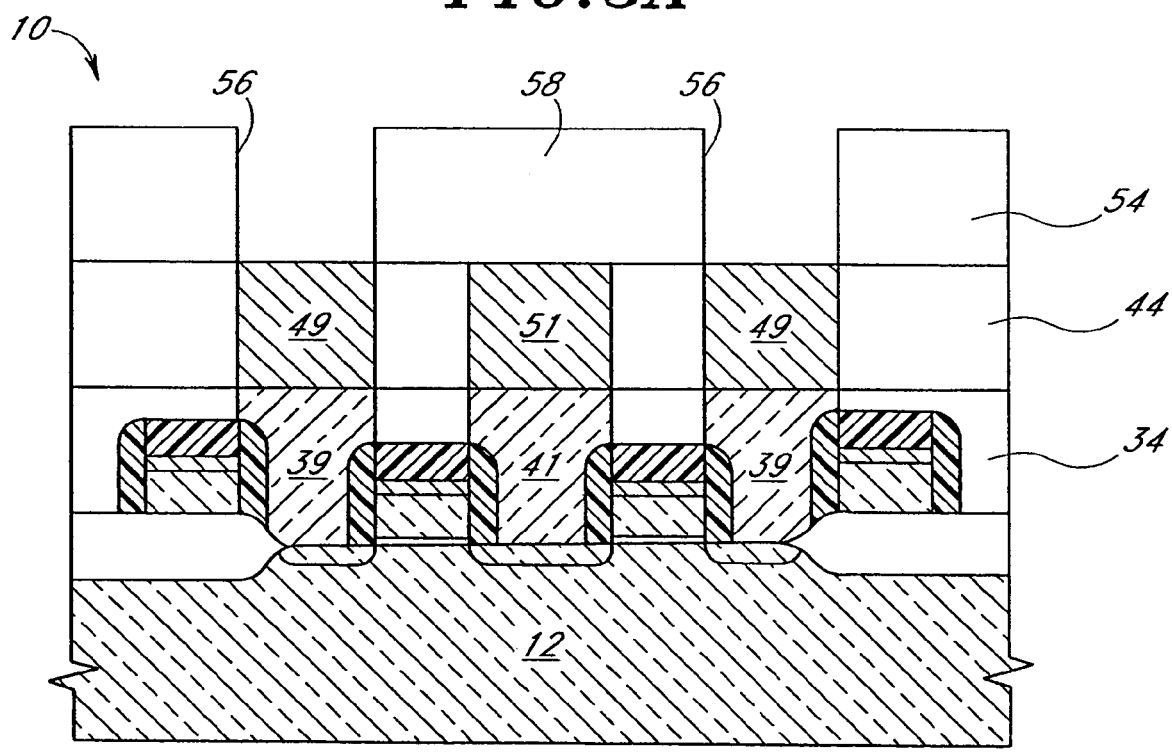
FIG. 3B shows the integrated circuit of FIG. 3A after a third interlevel dielectric layer has been deposited and etched to expose certain of the underlying conductive plugs, while shielding other conductive plugs.

With reference now to FIG. 3B, a third ILD 54, also preferably comprising BPSG, is formed over the second ILD 44 and the plugs 49, 51. In the illustrated embodiment, the thickness of the third ILD 54 is selected, in combination with the thickness of the second ILD 44, to complete the desired height of the cell capacitor. The illustrated third ILD 54 is thus preferably between about 0.8 μm and 2.0 μm, and more preferably between about 0.8 μm and 1.3 μm.

Vias 56 are then formed in the third ILD 54 to expose only the sacrificial capacitor plugs 49, while a shield portion 58 of the third ILD 54 remains over the second bit line plug 51. Desirably, the vias 56 are aligned and of mating cross-sectional configuration with the underlying sacrificial capacitor plugs 49, which are elliptical in the illustrated embodiment.

Figure 4:
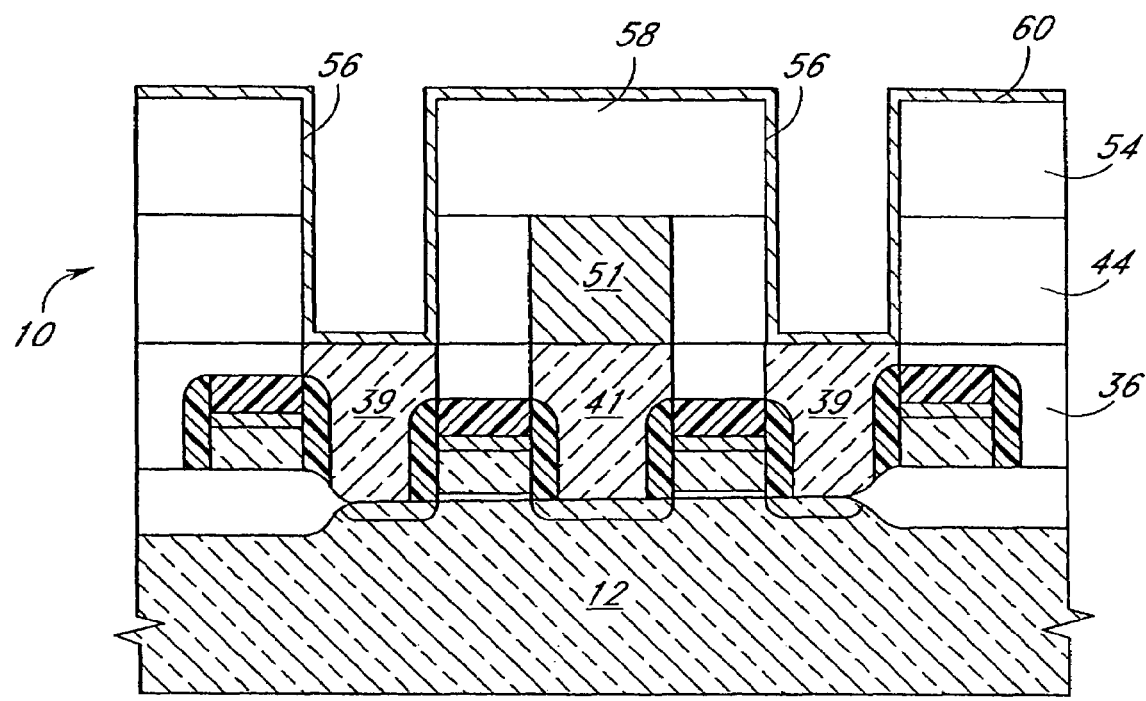
FIG. 4 illustrates the integrated circuit of FIG. 3B after the exposed conductive plugs have been removed, and a conformal conductive layer deposited over the wafer.

Referring to FIG. 4, the sacrificial capacitor plugs 49 are then selectively etched, relative to the surrounding insulators 54, 44, with the etch preferably stopping on the underlying capacitor contact plugs 39. In the illustrated embodiment, where the sacrificial plugs 49 comprise metal, a selective metal etch such as HCl can be employed to remove the plugs 49, as well as any metallic lining layers. As shown, the second bit line contact plug 51 remains protected from this etch by the mask (not shown) and shield portion 58 while the vias 56 are extended down to the capacitor contact plugs 39 by the removal of the sacrificial plugs.

In an alternative arrangement, one or two of the lining layers within the sacrificial plugs may be left by the selective etch and can serve as the bottom electrodes of the capacitors to be formed. As will be understood by the skilled artisan, such an arrangement would save electrode formation steps, as well as isolation steps.

In accordance with the illustrated embodiment, however, FIG. 4 shows the sacrificial plugs to have been completely removed and a conformal conductive layer 60 deposited into the extended vias 56 and over the remaining portions of the third ILD 54. Desirably, this conductive layer 60 is thin, and represents the bottom or storage electrode of the cell capacitor. An exemplary conductive layer comprises doped polysilicon, though metal and other conductive materials are suitable. As is known in the art, the conductive layer 60 may also include micro-texturing (e.g., hemispherical grained or HSG polysilicon) to further increase the plate surface area and thus increase cell capacitance. The conductive layer 60 has a thickness sufficient to provide conductivity, but thin enough to avoid crowding the interior of the container.

Figure 5:
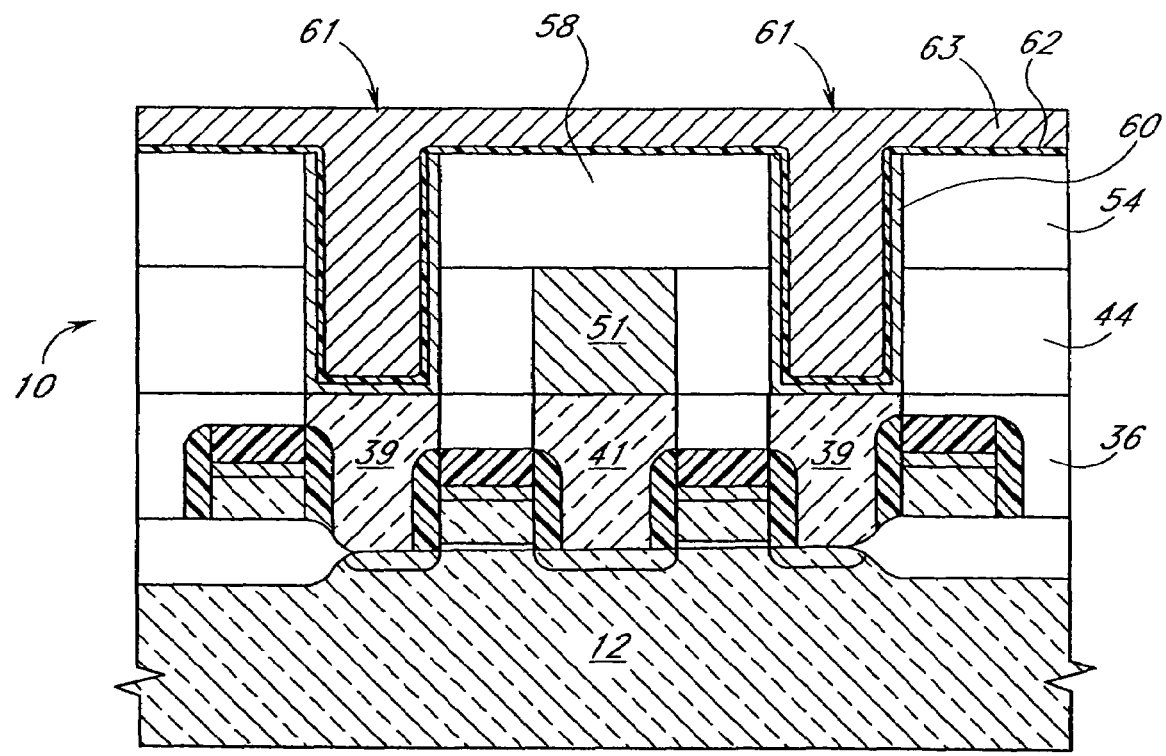
FIG. 5 illustrates the integrated circuit of FIG. 4 after the conformal conductive layer has been patterned to define capacitor bottom electrodes, and capacitor dielectric and top electrode layers deposited thereover.

With reference to FIG. 5, cell capacitors 61 are completed by patterning the conductive layer 60, such as by planarization, leaving container-shaped bottom electrodes. In some arrangements, portions of the third ILD can be removed at this stage to expose outer surfaces of the container, further increasing surface area. Bottom electrode isolation is followed by formation of the capacitor dielectric 62 and top or reference electrode 63. The capacitor dielectric 62 can comprise conventional materials, such silicon oxide, silicon nitride, oxynitride, and oxide-nitride-oxide (ONO), or it can comprise high permittivity materials such as barium strontium tantalate (BST), strontium bismuth tantalate (SBT), tantalum oxide, etc.

In the illustrated embodiment, both the capacitor dielectric 62 and the top electrode 63 are commonly formed across all cells in an array. In other arrangements, it will be understood that either or both layers 62, 63 can be isolated for each cell.

Figure 6:
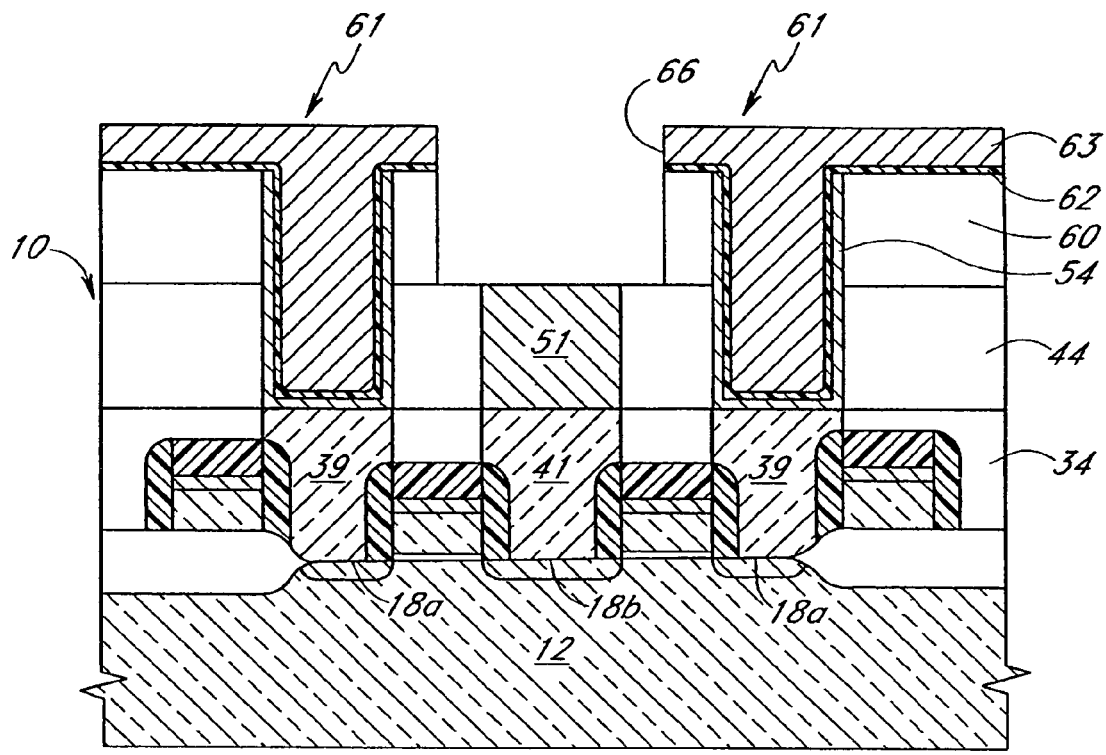
FIG. 6 illustrates the integrated circuit of FIG. 5 after a window has been formed through the top electrode.
Figure 7:
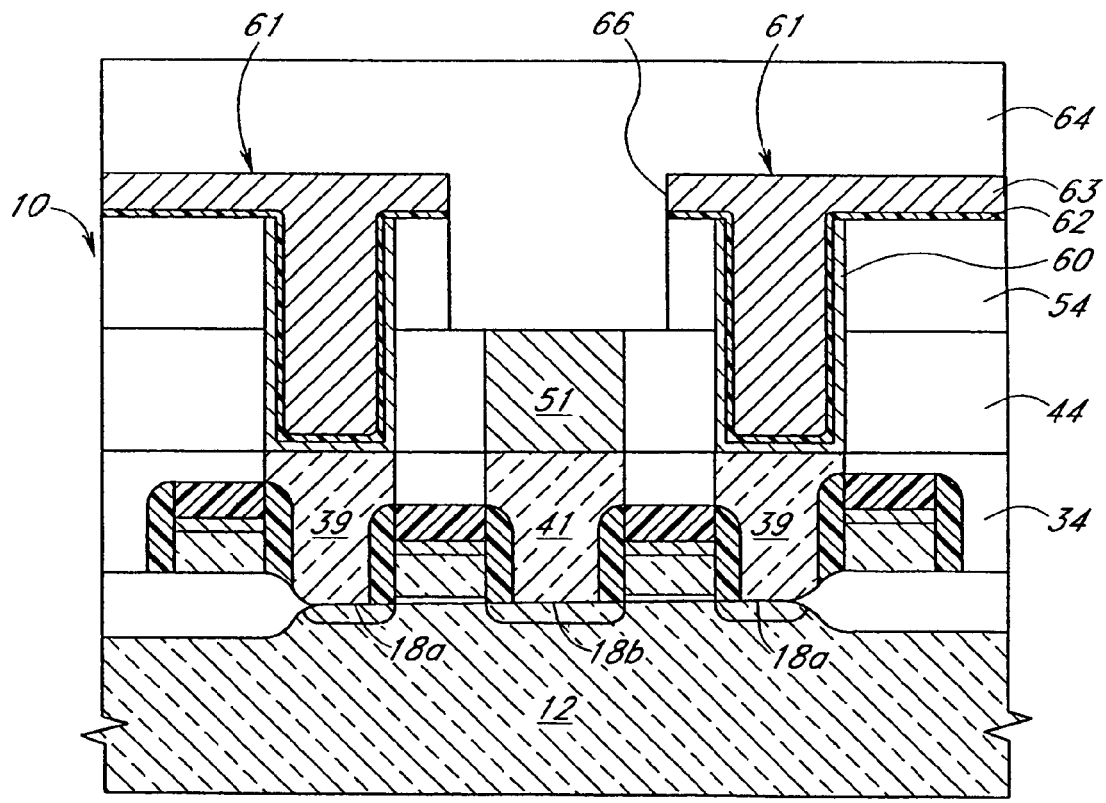
FIG. 7 illustrates the integrated circuit of FIG. 6 after a fourth interlevel dielectric has been deposited.

With reference now to FIGS. 6 and 7, a window 66 is formed through the common reference electrode 63 to permit formation of the bit line contact therethrough without shorting to electrode 63. Accordingly, the window 66 is formed wider than the desired bit line contact, such that the bit line contact can be isolated from the capacitors 61 by deposition of a fourth ILD layer 64 into the window 66, as shown in FIG. 7. The fourth ILD 64 is deposited to a thickness sufficient to isolate the capacitors 61 from the overlying bit line to be formed, and is preferably between about 0.2 µm and 0.6 µm, then planarized above the capacitors 61.

In the illustrated embodiment, the window 66 also extends through the capacitor dielectric 62 and the underlying shield portion 58 (see FIG. 5) of the third ILD layer 54, to expose the underlying second bit line contact plug 51. It will be understood, however, that the window could stop on either the capacitor dielectric or the third ILD layer, if desired, without requiring additional mask or etch steps. In any case, filling the window with the fourth ILD or forming insulative spacers over the exposed sidewalls of the capacitor electrode will serve to isolate the electrode from the bit line contact to be completed.

Figure 8:
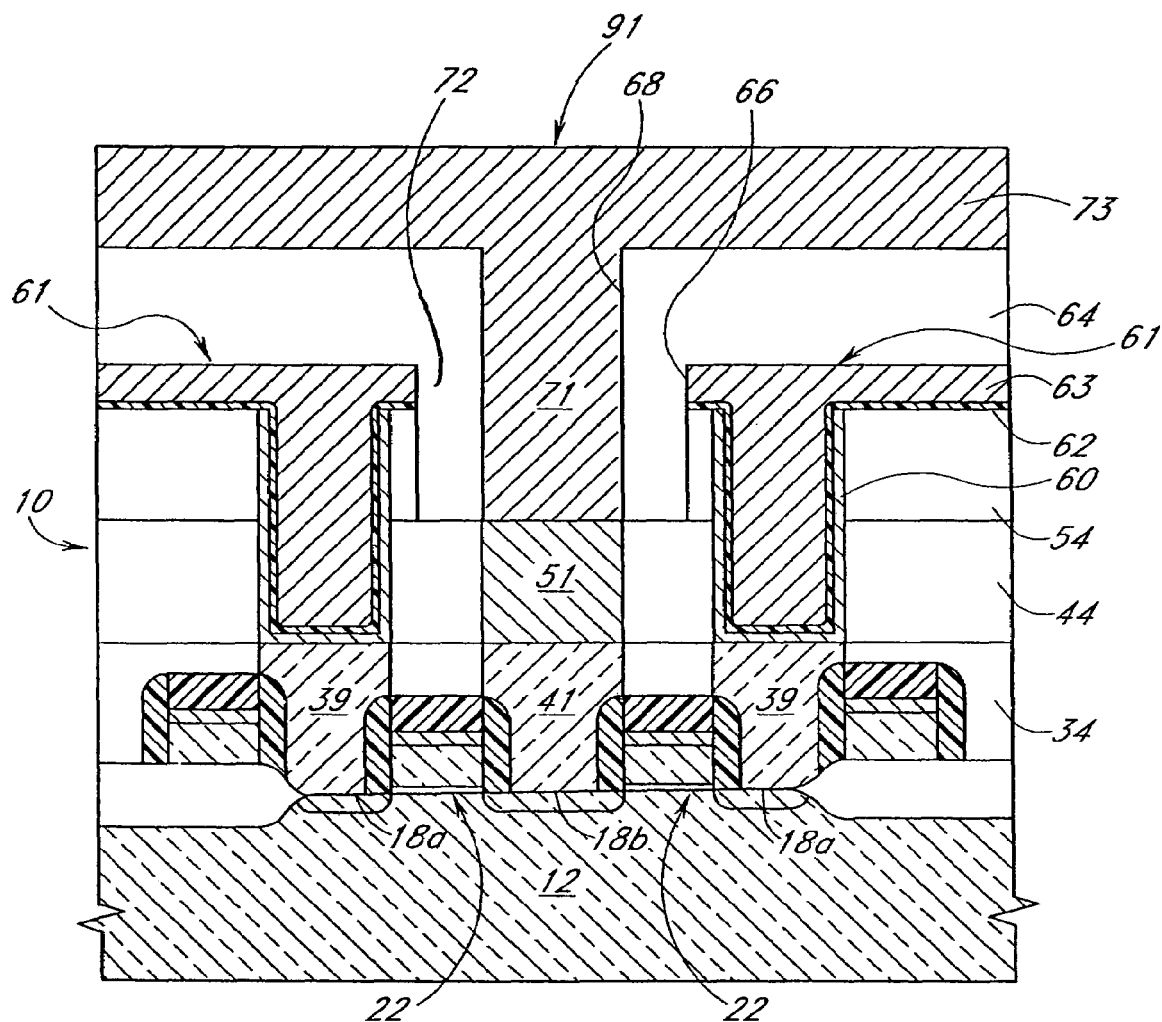
FIG. 8 shows the integrated circuit of FIG. 7 after formation of a bit line contact through the window.

With reference to FIG. 8, a third bit line contact via 68 is then etched through the fourth ILD 64, and a third bit line contact plug 71 formed therein. The third bit line via 68 is more narrow than the window 66 in the reference electrode 63. Accordingly, a portion of the fourth ILD 64 remains to serve as a spacer 72 surrounding the plug 71 and preventing the third bit line contact plug 71 from shorting to the electrode 63.

In the illustrated embodiment, the third bit line "plug" 71 is not truly a plug, as that term is conventionally used in the art to refer to a contact isolated a via only. Rather, the "plug" 71 is formed simultaneously with a bit line 73 above the fourth ILD 64, in accordance with known damascene or dual damascene process flows. While CVD processes can be used to facilitate good step coverage, the conductive material forming the bit line 73 and the third bit line contact plug 71 is preferably highly conductive compared to tungsten. Highly conductive metals are typically deposited by physical vapor deposition (e.g., sputtered aluminum alloy with 0.5% copper). Because the illustrated bit line contact plug 71 has a reduced height, compared to conventional processes, the designer has more flexibility in choosing such PVD metals for the plug 71, despite highly dense device packing.

Nevertheless, the illustrated embodiment also takes advantage of more recently developed metal fill processes, such as hot metal processes, involving high temperature deposition or reflow, or force-fill processes, involving extremely high pressure conditions. In accordance with such aggressive fill techniques, it is desirable to first line the via 68 prior to deposition of the metal, for better contact resistivity, adhesion and barrier protection. For example, the via 68 may be lined with a metal nitride, such as TiN, TaN, WN prior to forming the plug 71 and bit line 73. Preferably, Ti/TiN/W layers are deposited sequentially by CVD techniques.

While the overall height of the bit line contact 91 is preferably between about 2.5 µm and 5.0 µm (e.g., about 3.0 µm), the final deposition to form the third contact plug 71 is essentially defined by the thickness of the third and fourth ILDs 54, 64. Preferably, the third plug has a height between about 0.8 µm and 2.5 µm, and preferably between about 1.0 µm and 2.0 µm.

With reference to FIGS. 9-14, an elevated bit line plug is illustrated in accordance with another embodiment of the present invention. In the illustrated embodiment, the second bit line plug is constructed as high as the adjacent capacitors, and a separate shield formed to protect the plug during formation of the capacitors. In the drawings, elements which are similar to elements of FIGS. 1-8 shall be referred to by like reference numerals. Corresponding similar parts, which are different in significant ways, are referred to by like reference numerals with the addition of a prime (') symbol thereafter.

Figure 9:
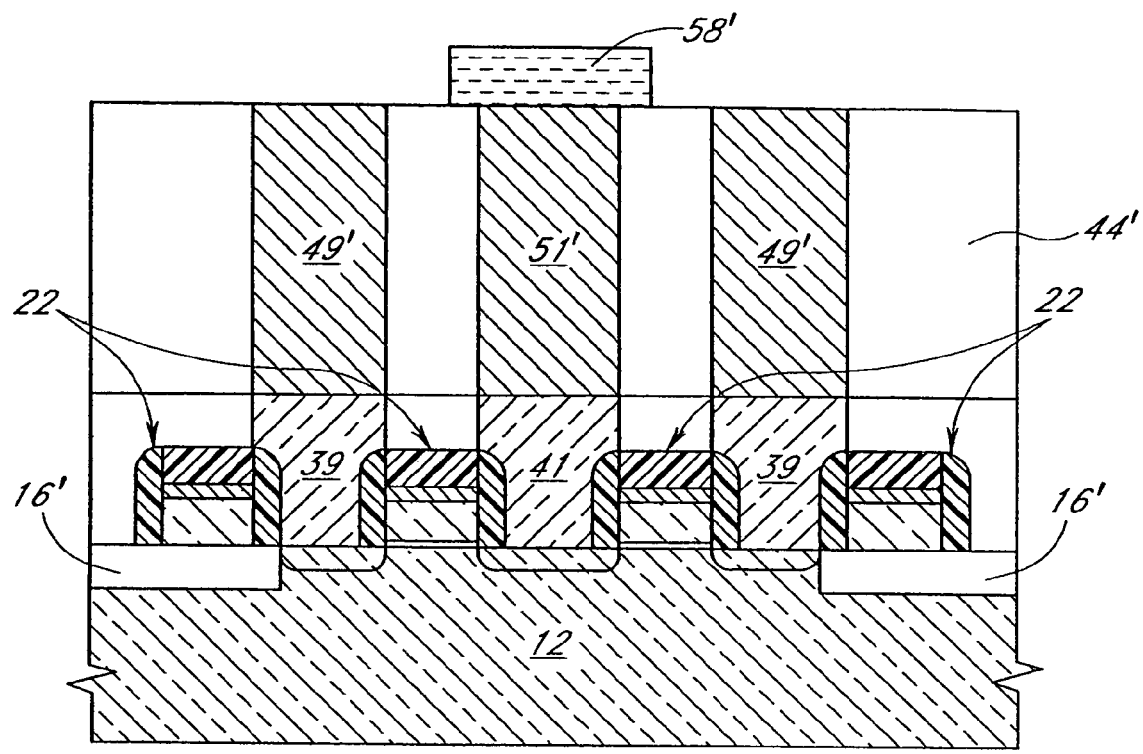
FIG. 9 is a partial, schematic, sectional view of a partially fabricated integrated circuit, constructed in accordance with another embodiment of the invention, having a plurality of aligned conductive plugs formed through two interlevel dielectric layers that cover the transistors.

Referring initially to FIG. 9, capacitor contact plugs 39 and first bit line plugs 41 have been formed between transistor gate electrodes 22 in a semiconductor substrate 12. Additionally, capacitor plugs 49' and second bit line plugs 51' have been formed within a second ILD 44'. Unlike the first embodiment, however, the transistors are isolated from one another by shallow trench isolation 16', rather than by local oxidation. Moreover, the each of the plugs 49', 51' are constructed to the full intended height of the capacitors to be formed. As also shown in FIG. 9, a photoresist shield 58' covers the second bit line plug 51', and extends laterally beyond the edges thereof.

Figure 10:
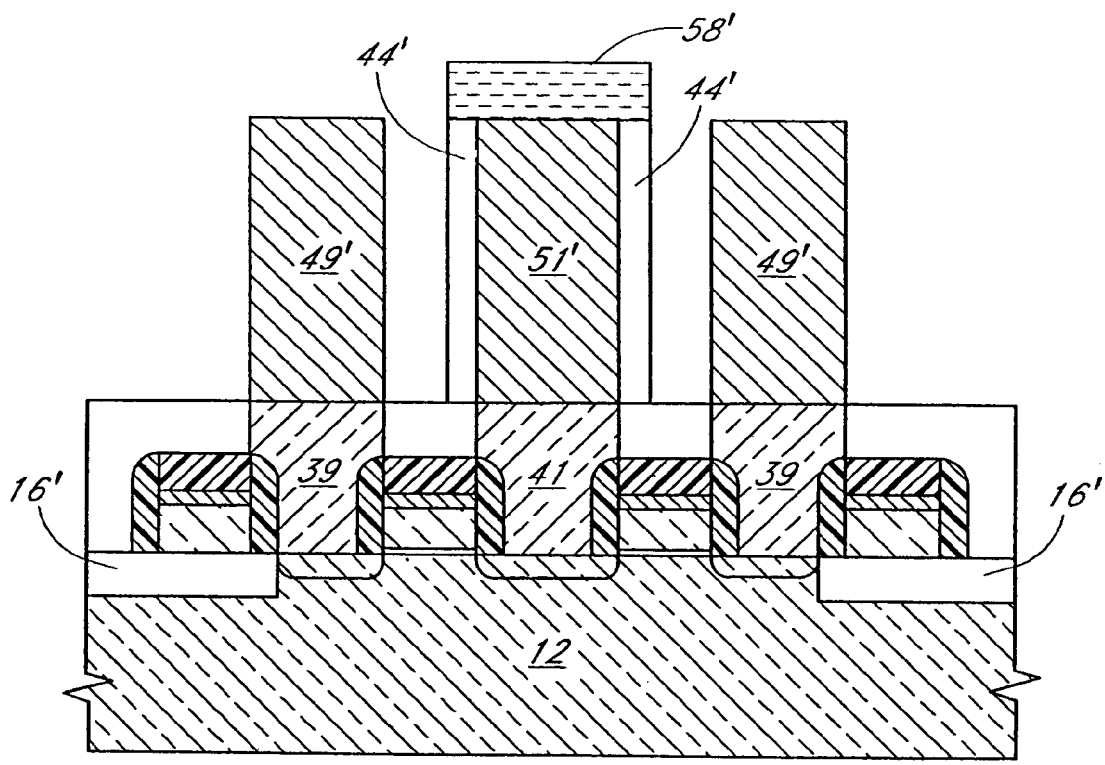
FIG. 10 shows the integrated circuit of FIG. 10 after the second interlevel dielectric has been substantially removed, except for sidewall spacers surrounding a partial bit line plug.

As shown in FIG. 10, the shield 58' serves to protect a portion of the second ILD 44' as the remainder of the second ILD 44' is removed. A sidewall spacer of the ILD 44' material is thus left surrounding the second bit line plug 51', while the capacitor plugs 49' are exposed.

In contrast to the previous embodiment, the capacitor plugs 49' are not sacrificial, but rather will serve as the bottom electrode of the capacitors to be formed. Advantageously, the electrodes for such "stud capacitors" are non-oxidizing conductors, facilitating use of high dielectric materials for the cell dielectric. For example, the capacitor plugs can comprise Ru, $RuO_x$, Pt, Ir, $IrO_x$, etc.

Figure 11:
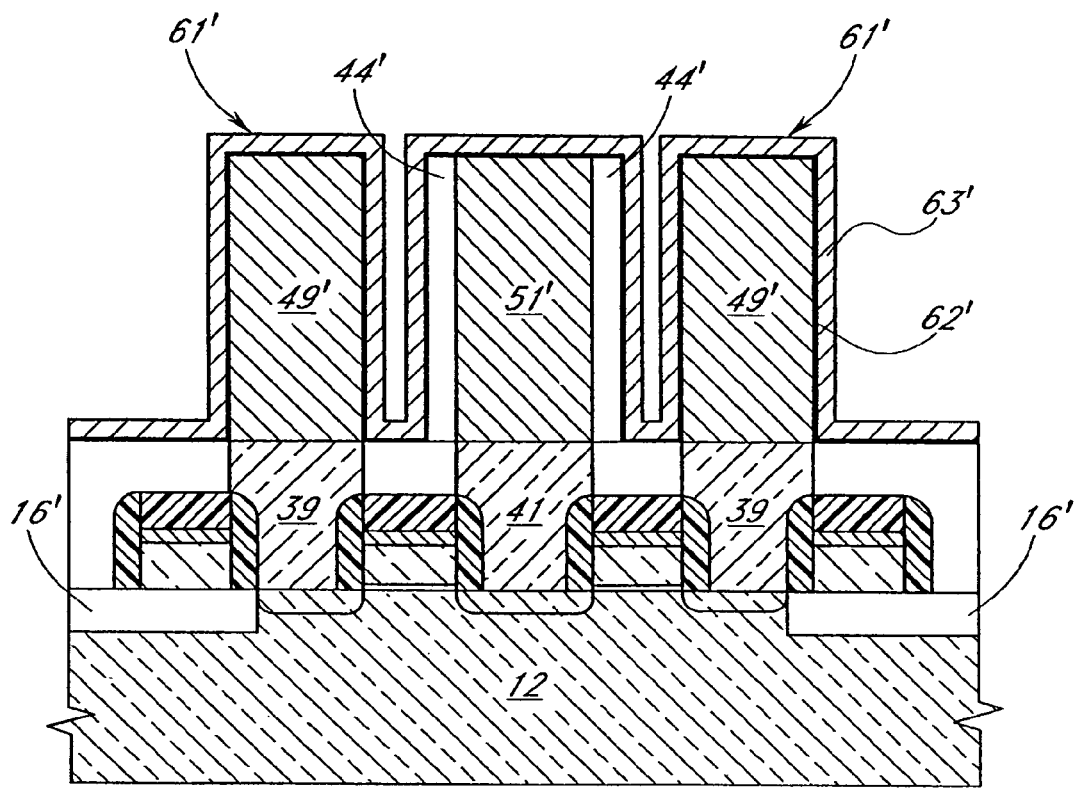
FIG. 11 shows the integrated circuit of FIG. 10 after formation of capacitor dielectric and top electrode layers.

With reference to FIG. 11, after the shield has been removed, the capacitor dielectric 62' and the top electrode 63' are deposited. Desirably, the capacitor dielectric 62' is characterized by a high effective dielectric constant, such as $Ta_2O_5$, BST, SBT, ST, BT, PZT, and other ceramics, complex oxides, ferroelectric materials and the like. Capacitors 61' are thereby completed.

Figure 12:
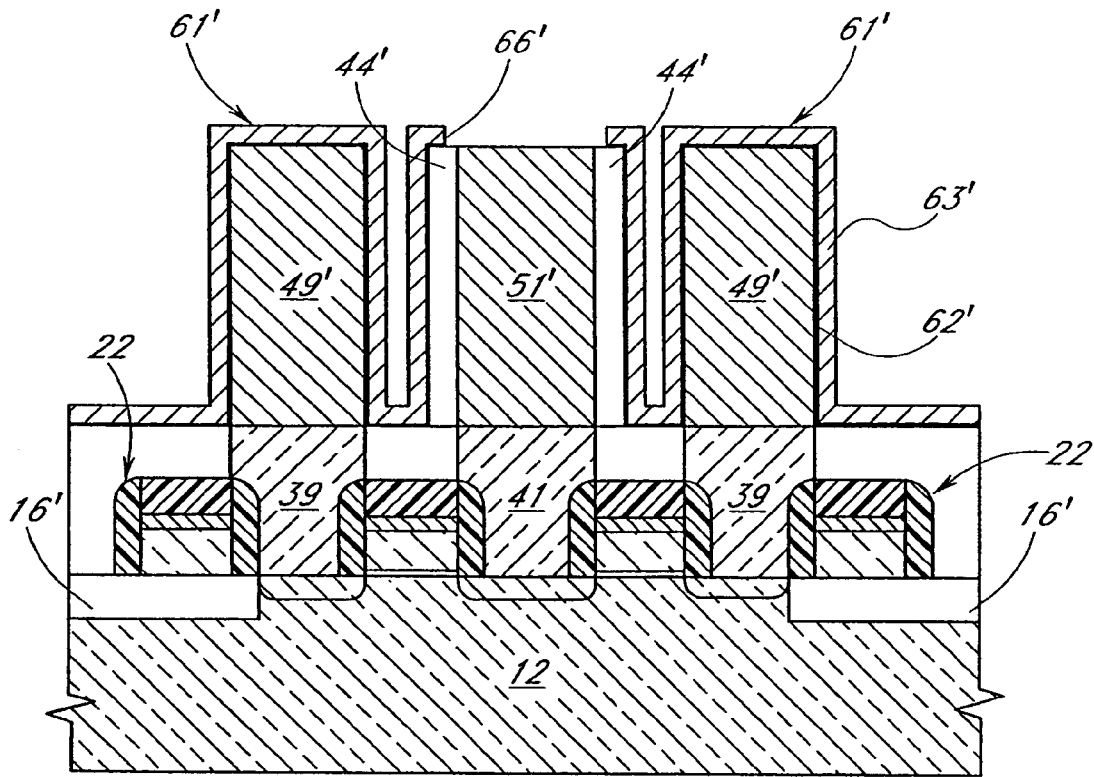
FIG. 12 shows the integrated circuit of FIG. 11 after a window has been opened in the top electrode and capacitor dielectric over the partial bit line plug.
Figure 13:
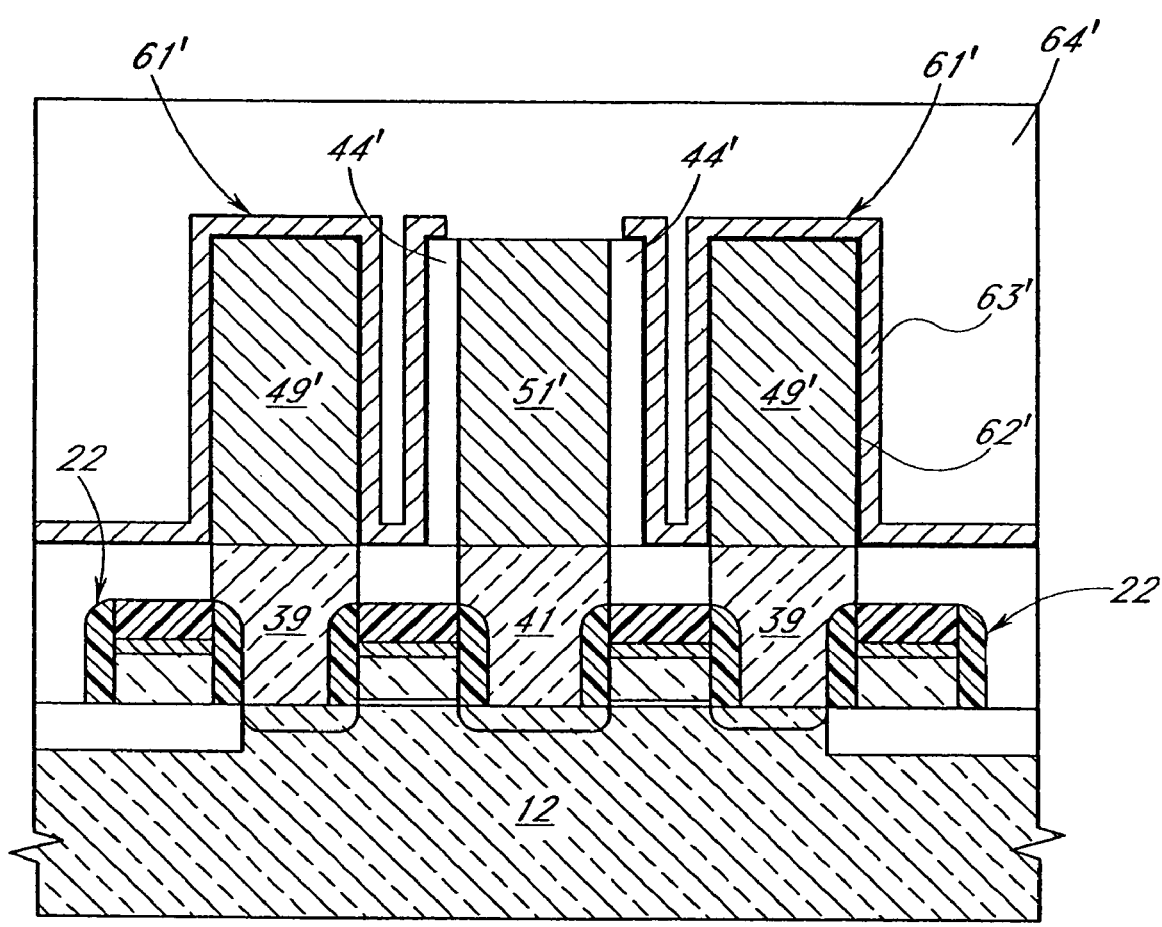
FIG. 13 shows the integrated circuit of FIG. 12 after a third interlevel dielectric has been deposited.

With reference to FIG. 12, a window 66' is then opened through the electrode layer 63' and dielectric layer 62', exposing the second bit line plug 51'. Desirably, the window 66' is wider than the second bit line plug 51', as shown. FIG. 13 shows the structure of FIG. 12 after deposition of a third ILD 64' over the capacitors 61' and the second bit line contact.

Figure 14:
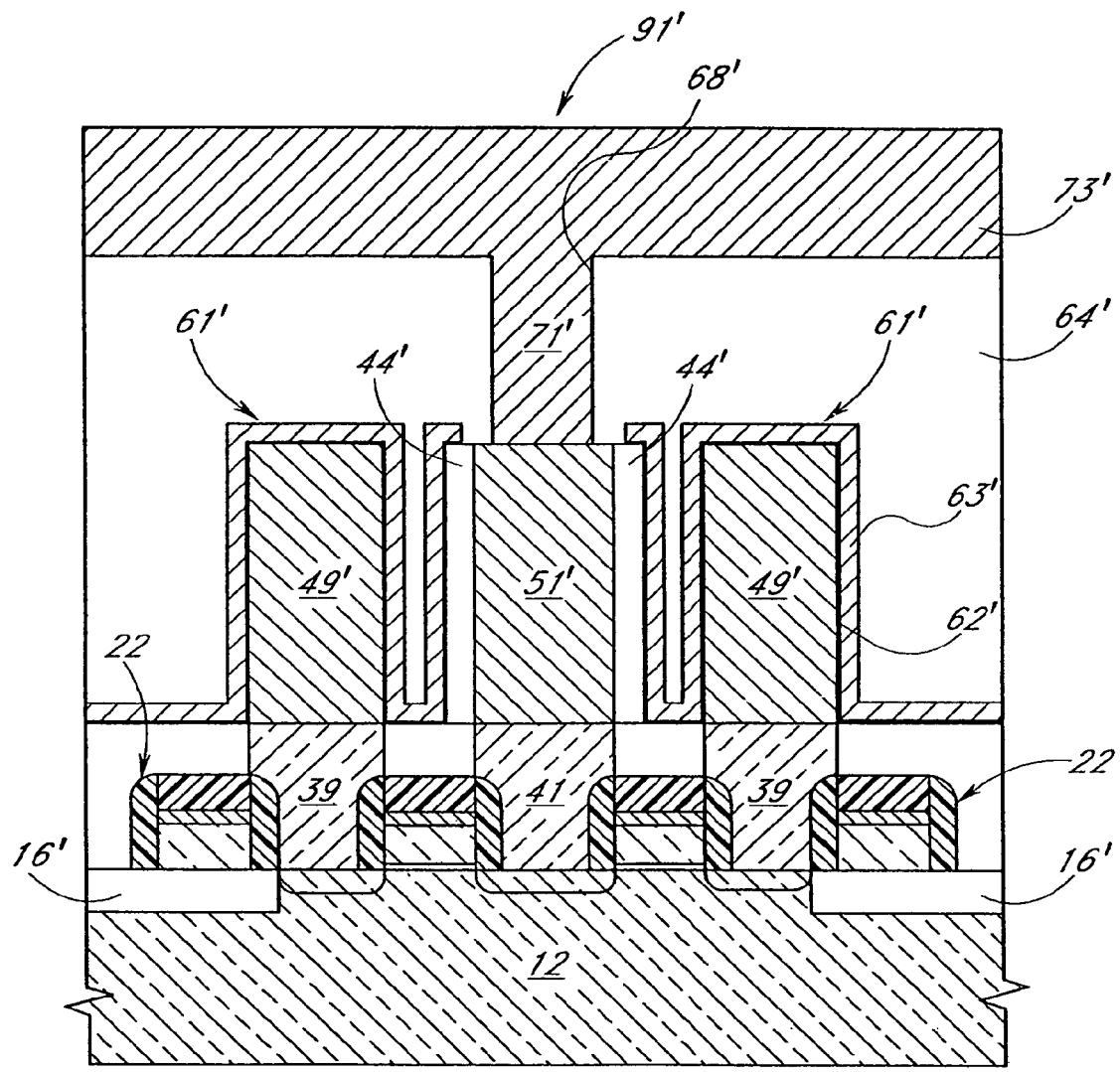
FIG. 14 shows the integrated circuit of FIG. 13 after extension of the bit line plug and formation of a bit line.

FIG. 14 then shows the structure after a contact via 68' is etched through the third ILD 64', and filled to form a third bit line plug 71', thereby completing the bit line contact 91'. Note that, in comparison to the previous process, the depth of the third bit line plug 71' is further reduced, and need only extend down to approximately the level of the capacitors 61'.

Advantageously, the disclosed processes reduce the aspect ratio of the bit line contact via 68 or 68' to be filled at the end of the process. A bit line contact 91, 91', from the bit line 73, 73' to the substrate 12, is thus made in three stages: the first bit line contact plug 41, 41', the second bit line contact plug 51, 51', and the third bit line contact plug 71, 71'. In other arrangements, the lower plugs 39, 41 or 39', 41' can be omitted, and the capacitors 61, 61' and bit line plugs 51, 51' can be formed in direct contact with the substrate 12.

Each of these contact plugs 41, 51, 71 or 41', 51', 71' are aligned with one another. It will be understood that "aligned," as used herein, does not imply complete overlap nor identical widths of the plugs. Rather, alignment refers to the arrangement such that the plugs define a single electrical path from the substrate 12 to the bit line 73, 73'. Thus, in application, the multiple levels of the bit line contact 91, 91' can exhibit slight misalignment and variation in widths. The skilled artisan will understand that the use of etch stop layers between ILDs can reduce the risk of shorting due to slight mask misalignment.

From another viewpoint, the bit line contact plug 71, 71' is raised, relative to conventional processes, to a level above the bottom of adjacent cell capacitors. Thus, where conventional bit line contacts must extend the full height of the stacked capacitors in addition to the height of the ILD separating the capacitors from the bit line, the final stage 71 of the bit line contact 91 of FIG. 8 extends only partway down the height of the capacitors. The final stage 71' of the bit line contact 91' of FIG. 14 extends upwardly from approximately the top of the capacitors 61'. As will be recognized by the skilled artisan, the reduced aspect ratio via is thus more readily filled with fewer voids and consequently better yield. Moreover, the process enables further scaling and may be extended to include multiple stages between the lower plug 41, 41' and the upper plug 71, 71'.

As will be understood by the skilled artisan, the processes and structures disclosed herein are applicable to forming interlevel contact through vias of high-aspect ratio, in general. The process has particular utility in the context of contacts through intermediate levels of device fabrication, such as the illustrated DRAM circuits with the bit line formed over stacked cell capacitors.

Thus, although, the invention has been described in terms of certain preferred embodiments and suggested possible modifications thereto, other embodiments and modifications will suggest themselves and be apparent to those of ordinary skill in the art. Such modifications are intended to also fall within the spirit and scope of the present invention, which should accordingly be defined by reference to the appended claims.

We claim:

1. A method of forming a contact adjacent a stacked capacitor in an integrated circuit, the method comprising:
    forming the stacked capacitor, the stacked capacitor having a bottom at a first level and a top at a second level above the first level, wherein the stacked capacitor comprises a plurality of electrodes;
    forming an insulating layer above the stacked capacitor;
    etching the insulating layer to form a via adjacent the stacked capacitor, the via exposing a conductive element extending upwardly from the first level to about the second level or lower; and
    filling the via with a conductive material to form the contact adjacent the stacked capacitor.

2. The method of claim 1, wherein etching the insulating layer exposes the conductive element at a height above the first level, wherein the height is more than about 20% of a distance from the first level to the second level.

3. The method of claim 2, wherein the height is at least about 50% of the distance between the first level and the second level.

4. The method of claim 3, wherein the height is about level with the second level.

5. The method of claim 1, further comprising depositing a conducting line above the insulating layer in electrical contact with the contact.

6. The method of claim 1, wherein the conductive element comprises a metal plug.

7. The method of claim 1, wherein filling the via forms a bit line contact in a memory array.

8. A process for forming a contact adjacent a stacked capacitor in an integrated circuit, comprising:
    providing the stacked capacitor adjacent a conductive plug, wherein bottoms of the stacked capacitor and the conductive plug are disposed substantially at a first level, wherein a top of the stacked capacitor is disposed at a second level, and wherein a top of the conductive plug is disposed at about the second level or lower;
    etching a via in insulating material overlying the conductive plug, the via extending from the top of the conductive plug to above the second level; and
    depositing metal into the via.

9. The process of claim 8, wherein the insulating material overlies the stacked capacitor.

10. The process of claim 9, wherein the insulating material has a thickness of about 0.2-0.6 µm over the stacked capacitor.

11. The process of claim 8, wherein the insulating material comprises borophosphosilicate glass.

12. The process of claim 8, wherein depositing the metal into the via comprises performing a physical vapor deposition.

13. The process of claim 8, further comprising lining the via with a barrier layer before depositing the metal into the via.

14. The process of claim 13, wherein the barrier layer comprises a metal nitride.

15. The process of claim 8, wherein the conductive plug comprises a metal.

16. The process of claim 15, wherein the conductive plug comprises aluminum.

17. The process of claim 16, wherein the conductive plug comprises copper.

18. A process for forming a contact adjacent an electrical device in an integrated circuit, comprising:
    providing an electrical device adjacent a conductive plug, wherein bottoms of the electrical device and the conductive plug are disposed substantially at a first level, wherein a top of the electrical device is disposed at a second level, and wherein a top of the conductive plug is disposed at about the second level or lower;
    etching a via in insulating material overlying the conductive plug, the via extending from the top of the conductive plug to above the second level; and
    depositing metal into the via, wherein depositing the metal into the via simultaneously forms a conductive line overlying the via.

19. The process of claim 18, wherein the conductive line is a bit line of a memory array.

* * * * *